United States Patent
Nolten et al.

(10) Patent No.: US 12,387,987 B2
(45) Date of Patent: Aug. 12, 2025

(54) HOUSING, SEMICONDUCTOR MODULE COMPRISING A HOUSING AND METHOD FOR PRODUCING A HOUSING

(71) Applicant: Infineon Technologies AG, Neubiberg (DE)

(72) Inventors: Ulrich Nolten, Rüthen (DE); Karsten Wolff, Soest (DE)

(73) Assignee: Infineon Technologies AG, Neubiberg (DE)

( * ) Notice: Subject to any disclaimer, the term of this patent is extended or adjusted under 35 U.S.C. 154(b) by 442 days.

(21) Appl. No.: 18/075,892

(22) Filed: Dec. 6, 2022

(65) Prior Publication Data

US 2023/0187291 A1    Jun. 15, 2023

(30) Foreign Application Priority Data

Dec. 10, 2021 (EP) ................................ 21213708

(51) Int. Cl.
| | |
|---|---|
| *H01L 23/053* | (2006.01) |
| *H01L 21/48* | (2006.01) |
| *H01L 23/00* | (2006.01) |
| *H01L 23/498* | (2006.01) |

(Continued)

(52) U.S. Cl.
CPC ........ *H01L 23/053* (2013.01); *H01L 21/4803* (2013.01); *H01L 23/49811* (2013.01); *H01L 24/32* (2013.01); *H01L 24/48* (2013.01); *H01L 24/73* (2013.01); *H01L 25/072* (2013.01); *H01L 25/18* (2013.01); *H01L 2224/32225* (2013.01);

(Continued)

(58) Field of Classification Search
CPC ............. H01L 23/053; H01L 23/49811; H01L 21/4803; H01L 24/32; H01L 24/48; H01L 24/73; H01L 25/072; H01L 25/18; H01L 2224/32225; H01L 2224/48225; H01L 2224/73265

See application file for complete search history.

(56) References Cited

U.S. PATENT DOCUMENTS

| | | | |
|---|---|---|---|
| 2010/0133681 A1* | 6/2010 | Oka | ................ H01L 23/041 |
| | | | 257/693 |
| 2013/0277819 A1* | 10/2013 | Yoshida | ................ H01L 25/072 |
| | | | 257/687 |
| 2021/0305109 A1* | 9/2021 | Uhlig | ................ H01L 25/18 |

FOREIGN PATENT DOCUMENTS

| | | |
|---|---|---|
| DE | 102014115812 A1 | 5/2016 |
| EP | 3736855 A1 | 11/2020 |
| EP | 3736858 A1 | 11/2020 |

* cited by examiner

*Primary Examiner* — Peniel M Gumedzoe
(74) *Attorney, Agent, or Firm* — Murphy, Bilak & Homiller, PLLC (57) ABSTRACT

A housing for a power semiconductor module includes sidewalls and a top that includes a first surface extending in a first horizontal plane and a second surface opposite and in parallel to the first surface, a plurality of openings of a first kind, each of the plurality of openings of the first kind including a first through hole extending through the top from the first surface to the second surface, and a plurality of openings of a second kind, each of the plurality of openings of the second kind comprising a second through hole extending through the top from the first surface to the second surface. Each of the plurality of openings of the first kind includes a collar or sleeve. Each of the plurality of openings of the second kind includes a trench or indentation arranged adjacent to and forming a closed loop around the respective second through hole.

15 Claims, 7 Drawing Sheets

(51) Int. Cl.
 *H01L 25/07* (2006.01)
 *H01L 25/18* (2023.01)
(52) U.S. Cl.
 CPC ............... *H01L 2224/48225* (2013.01); *H01L 2224/73265* (2013.01)

HOUSING, SEMICONDUCTOR MODULE COMPRISING A HOUSING AND METHOD FOR PRODUCING A HOUSING

TECHNICAL FIELD

The instant disclosure relates to a housing, a semiconductor module comprising a housing, and to a method for producing a housing.

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer may optionally be attached to a base plate.

The semiconductor substrate and the elements mounted thereon are usually electrically coupled to the outside of the housing by means of terminal elements. Such terminal elements are electrically coupled to the substrate or one or more of the elements mounted thereon with a first end, and extend from the substrate through a through hole in the housing to the outside of the housing. A power semiconductor module arrangement usually comprises a plurality of such terminal elements. Different terminal elements may be coupled to the same or to different electrical potentials. If two terminal elements that are coupled to different electrical potentials are arranged close to each other, a creepage distance between the second ends of such terminal elements outside of the housing may be shorter than a minimal creepage distance.

There is a need for a housing and a power semiconductor module comprising a housing wherein a length of the creepage distances between neighboring terminal elements may be increased.

SUMMARY

A housing for a power semiconductor module includes sidewalls and a top, wherein the top includes a first surface extending in a first horizontal plane and a second surface opposite and in parallel to the first surface, a plurality of openings of a first kind, each of the plurality of openings of the first kind including a first through hole extending through the top from the first surface to the second surface, and a plurality of openings of a second kind, each of the plurality of openings of the second kind comprising a second through hole extending through the top from the first surface to the second surface. The plurality of openings of the first kind and the plurality of openings of the second kind are arranged alternatingly in a regular pattern, each of the plurality of openings of the first kind includes a collar or sleeve arranged adjacent to and forming a closed loop around the respective first through hole, and each of the plurality of openings of the second kind includes a trench or indentation arranged adjacent to and forming a closed loop around the respective second through hole.

A power semiconductor module arrangement includes a substrate, at least one semiconductor body arranged on a top surface of the substrate, and a housing, wherein the substrate with the at least one semiconductor body arranged thereon is arranged within the housing.

A top of a housing includes a first surface extending in a first horizontal plane and a second surface opposite and in parallel to the first surface. A method for forming the top includes forming a plurality of openings of a first kind, each of the openings of the first kind comprising a first through hole that extends through the top from the first surface to the second surface, and forming a plurality of openings of a second kind, each of the openings of the second kind comprising a second through hole that extends through the top from the first surface to the second surface, wherein the plurality of openings of the first kind and the plurality of openings of the second kind are arranged alternatingly in a regular pattern, each of the plurality of openings of the first kind comprises a collar or sleeve arranged adjacent to and forming a closed loop around the respective first through hole, and each of the plurality of openings of the second kind comprises a trench or indentation arranged adjacent to and forming a closed loop around the respective second through hole.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

BRIEF DESCRIPTION OF THE DRAWINGS

FIG. 11, including FIGS. 11A and 11B, schematically illustrates cross-sectional views of different sections of a top of a housing according to FIG. 10.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
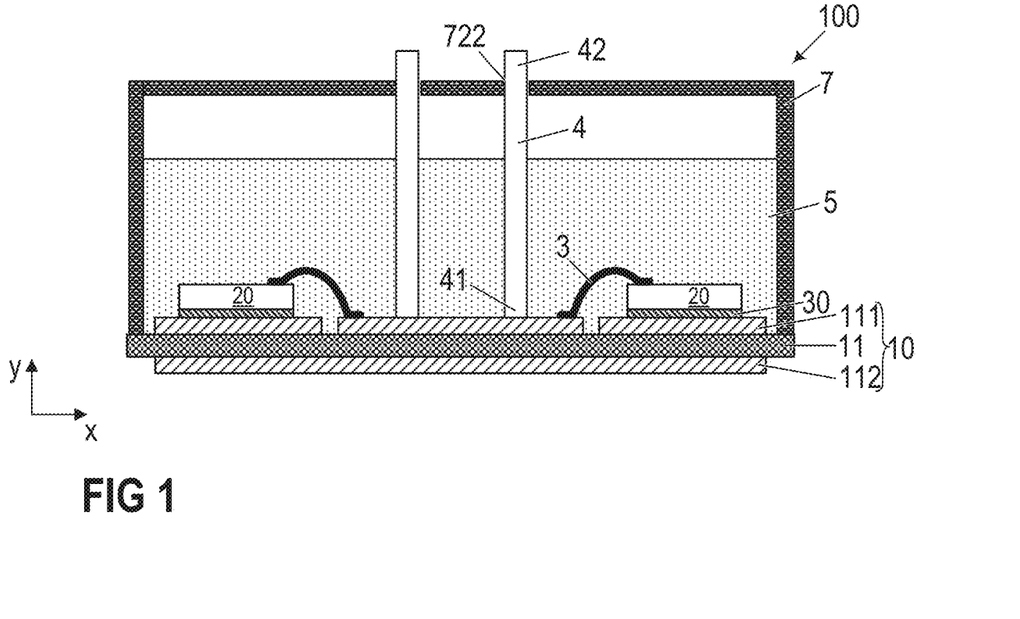
FIG. 1 is a cross-sectional view of a power semiconductor module arrangement.

Referring to FIG. 1, a cross-sectional view of a power semiconductor module arrangement 100 is illustrated. The power semiconductor module arrangement 100 includes a housing 7 and a semiconductor substrate 10. The semiconductor substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The semiconductor substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $SiO_2$, $Al_2O_3$, AlN, or BN and may have a diameter of between about fpm and about 50 µm. The substrate 10 may also be a conventional printed circuit board (PCB) having a non-ceramic dielectric insulation layer 11. For instance, a non-ceramic dielectric insulation layer 11 may consist of or include a cured resin.

The semiconductor substrate 10 is arranged in a housing 7. In the example illustrated in FIG. 1, the semiconductor substrate 10 forms a ground surface of the housing 7, while the housing 7 itself solely comprises sidewalls and a top or cover. This, however, is only an example. It is also possible that the housing 7 further comprises a ground surface and the semiconductor substrate 10 be arranged inside the housing 7. According to another example, the semiconductor substrate 10 may be mounted on a base plate (not illustrated). In some power semiconductor module arrangements 100, more than one semiconductor substrate 10 is arranged on a single base plate. The base plate may form a ground surface of the housing 7, for example. The top of the housing 7 can either be a separate cover or lid that can be removed from the sidewalls, or may be formed integrally with at least the sidewalls of the housing 7. In the latter case, the top and at least the sidewalls of the housing 7 may be formed as a single piece such that the top cannot be removed from the sidewalls without destroying the housing.

One or more semiconductor bodies 20 may be arranged on the semiconductor substrate 10. Each of the semiconductor bodies 20 arranged on the semiconductor substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element.

The one or more semiconductor bodies 20 may form a semiconductor arrangement on the semiconductor substrate 10. In FIG. 1, only two semiconductor bodies 20 are exemplarily illustrated. The second metallization layer 112 of the semiconductor substrate 10 in FIG. 1 is a continuous layer. The first metallization layer 111 is a structured layer in the example illustrated in FIG. 1. "Structured layer" means that the first metallization layer 111 is not a continuous layer, but includes recesses between different sections of the layer. Such recesses are schematically illustrated in FIG. 1. The first metallization layer 111 in this example includes three different sections. Different semiconductor bodies 20 may be mounted to the same or to different sections of the first metallization layer 111. Different sections of the first metallization layer may have no electrical connection or may be electrically connected to one or more other sections using electrical connections, e.g., bonding wires 3. Electrical connections may also include connection plates or conductor rails, for example, to name just a few examples. The one or more semiconductor bodies 20 may be electrically and mechanically connected to the semiconductor substrate 10 by an electrically conductive connection layer 30. Such an electrically conductive connection layer may be a solder layer, a layer of an electrically conductive adhesive, or a layer of a sintered metal powder, e.g., a sintered silver powder, for example.

The power semiconductor module arrangement 100 illustrated in FIG. 1 further includes terminal elements 4. The terminal elements 4 are electrically connected to the first metallization layer 111 and provide an electrical connection between the inside and the outside of the housing 7. The terminal elements 4 may be electrically connected to the first metallization layer 111 with a first end 41, while a second end 42 of the terminal elements 4 protrudes out of the housing 7. The terminal elements 4 may be electrically contacted from the outside at their second end 42. The terminal elements 4 illustrated in FIG. 1, however, are only examples. Terminal elements 4 may be implemented in any other way and may be arranged anywhere within the housing 7. For example, one or more terminal elements 4 may be arranged close to or adjacent to the sidewalls of the housing 7. Any other suitable implementation is possible. The terminal elements 4 may consist of or include a metal such as copper, aluminum, gold, or silver, for example.

Conventional power semiconductor module arrangements 100 generally further include a casting compound 5. The casting compound 5 may consist of or include a silicone gel or may be a rigid molding compound, for example. The casting compound 5 may at least partly fill the interior of the housing 7, thereby covering the components and electrical connections that are arranged on the semiconductor substrate 10. The terminal elements 4 may be partly embedded in the casting compound 5. At least their second ends 42, however, are not covered by the casting compound 5 and protrude from the casting compound 5 through through holes 722 of the housing 7 to the outside of the housing 7. The casting compound 5 is configured to protect the components and electrical connections inside the power semiconductor module 100, in particular inside the housing 7, from certain environmental conditions and mechanical damage. The casting compound 5 further provides for an electrical isolation of the components inside the housing 7.

Figure 2:
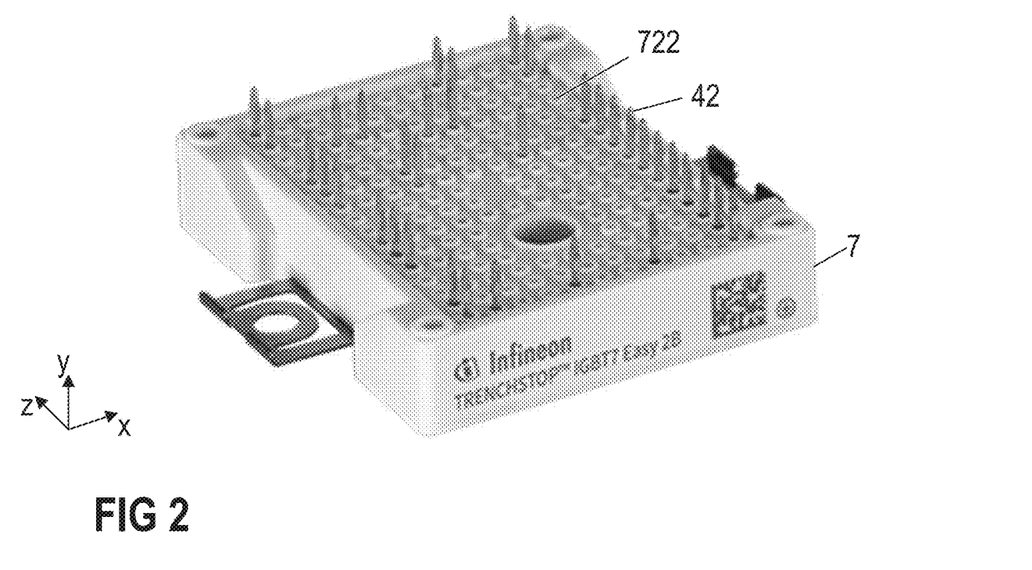
FIG. 2 is a diagonal view of a power semiconductor module arrangement.

FIG. 2 schematically illustrates a semiconductor module with a plurality of terminal elements 4 (second ends 42 of terminal elements) protruding through through holes 722 out of the top of the housing 7. The top in this example comprises a plurality of through holes 722. Terminal elements 4 may protrude out of some but not all of the through holes 722. By providing a plurality of through holes 722 in the top, one and the same housing 7 can be used for many different layouts or applications without the need for customizing the housing 7 for specific applications or customers.

For example, each of the through holes 722 may have a round, square, or any other suitable cross-section, and each terminal element 4 may protrude (centrally) through one of the through holes 722.

As can be seen in FIG. 2, it is possible that different terminal elements 4 extend through neighboring through holes 722. Terminal elements 4 are generally used to electrically contact the components inside the housing 7. The terminal elements 4, therefore, are usually coupled to different electrical potentials during the use of the power semiconductor module arrangement. It is not always possible to arrange terminal elements 4 that are connected to different electrical potentials distant to each other in the power semiconductor module arrangement. Therefore, it is possible that one terminal element 4 is coupled to a first electrical potential (e.g., positive potential), while a neighboring terminal element 4 is coupled to a second electrical potential that is different from the first electrical potential (e.g., negative potential). In order to avoid short circuits, electric flashovers or breakthroughs between such neighboring terminal elements 4, a creepage distance between two neighboring terminal elements 4 should be longer than a minimum creepage distance. The creepage distance generally is the shortest path along the surface of a solid insulating material between two conductive parts.

Figure 3:
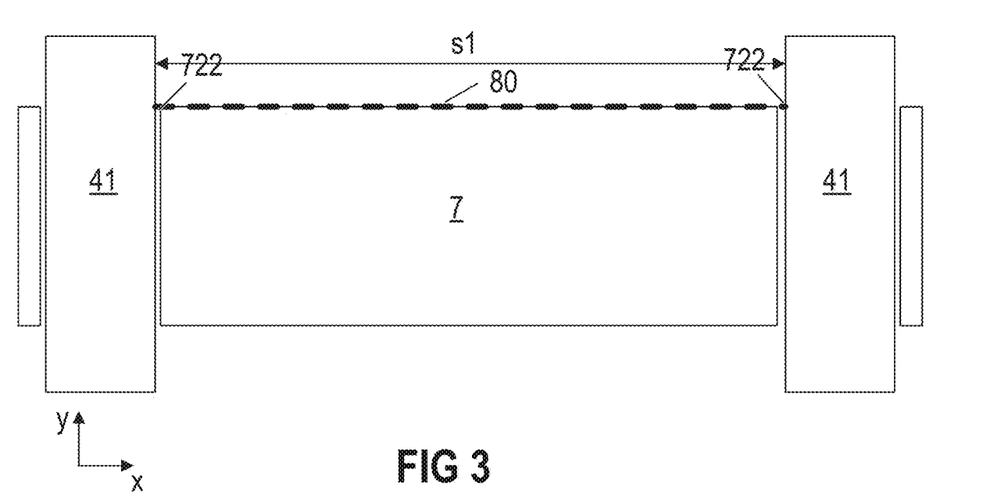
FIG. 3 is a cross-sectional view of a section of a housing.

This is schematically illustrated for a flat surface in the cross-sectional view of FIG. 3. FIG. 3 schematically illustrates a section of a top of a housing 7 between two neighboring through holes 722. In this example, the creepage distance 80 is defined by a direct path between the terminal elements 4 arranged in the neighboring through holes 722. That is, the creepage distance 80 corresponds to the shortest distance s1 between the terminal elements 4.

The creepage distance 80 can be extended by providing trenches 730, 732 in or protrusions 734 on the surface. This is schematically illustrated in the cross-sectional view of FIG. 4. The creepage distance 80 is extended by double the height h734 of a protrusion 734 and by double the depth d732 of a trench 732, if the width w732 of the trench 732 is larger than a minimum width. In the example illustrated in FIG. 4, one of the trenches 730 has a width w730 that is less than the minimum width. Therefore, the depth d730 of this trench does not extend the creepage distance 80. The minimum width of a trench that is necessary to achieve an extension of the creepage distance 80 generally depends on different factors such as, e.g., a degree of contamination of the environment in which the power semiconductor module arrangement is mounted during use. Different degrees of contamination may include clean room environment, normal environment, or highly contaminated environment, for example. In a normal environment, the minimum width that is required for a trench to be able to extend the creepage distance may be 1 mm, for example. This minimum width may be shorter in a clean room environment, and longer in a highly contaminated environment.

Figure 5:
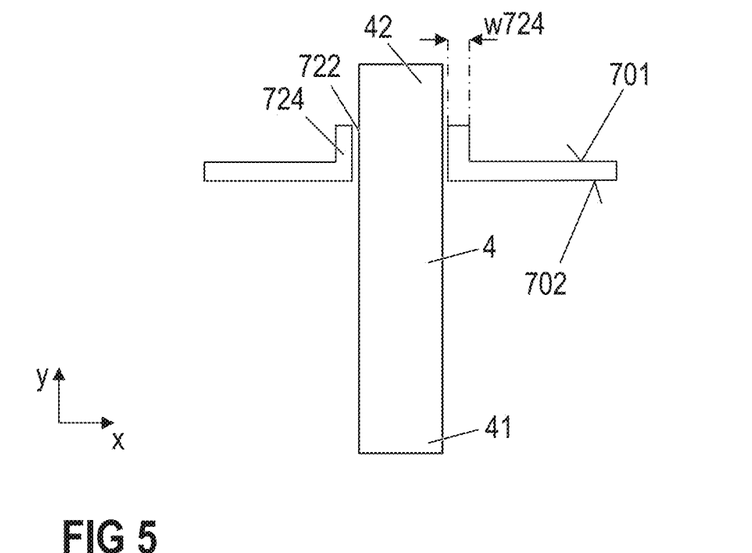
FIG. 5 is a cross-sectional view of another section of a housing.

In the example illustrated in FIG. 5, a collar or sleeve 724 is formed around the through hole 722. That is, a thickness of the cover of the housing 7 is locally increased in an area directly adjoining the through hole 722. The collar or sleeve 724 forms a closed loop around the circumference of the through hole 722. A width w724 of the collar or sleeve 724 in a horizontal direction may be between 0 and 2 mm, for example. A cross-sectional area of a terminal element 4 is smaller than a cross-sectional area of the through hole 722. If, for example, the terminal element 4 and the through hole 722 each have a rounded cross-section, a diameter of the terminal element 4 may be smaller than a diameter of the respective opening. The form of the collar or sleeve 724 may correspond to the form of the through hole 722. That is, the collar or sleeve 724 and the through hole 722 may have a round, oval, rectangular, or square form, for example. Other forms are generally also possible.

Figure 6:
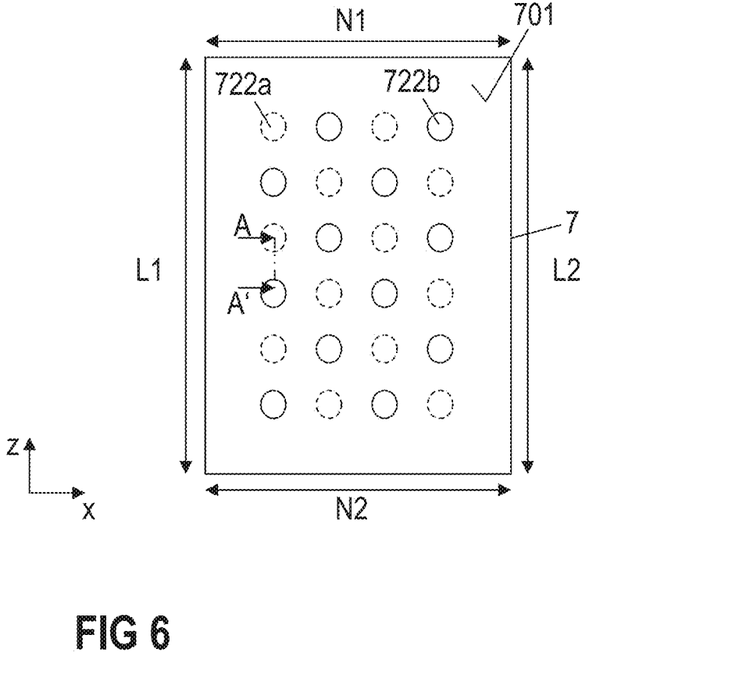
FIG. 6 is a top view of a top of a housing according to one example.

Now referring to FIG. 6, the cover of the housing 7 may comprise openings of a first kind 722a and openings of a second kind 722b. The openings of the first and second kind 722a, 722b may be arranged in rows and columns, wherein the openings of the first kind 722a and the openings of the second kind 722b are arranged alternatingly within the rows and columns. The housing 7 may have a rectangular form, for example. That is, the housing 7 may comprise first and second longitudinal sides L1, L2, and first and second narrow sides N1, N2. The rows of openings 722a, 722b may be arranged parallel to the narrow sides N1, N2, and the columns of openings 722a, 722b may be arranged parallel to the longitudinal sides L1, L2. The housing 7, however, can also have other forms. Therefore, it is also possible that the rows and columns of openings 722a, 722b are not parallel to any of the sides of the housing 7.

Arranging the openings of the first kind 722a and the openings of the second kind 722b in rows and columns, however, is only one example. It is generally possible to arrange the openings of the first kind 722a and the openings of the second kind 722b alternatingly in any kind of regular pattern. For example, it is possible to arrange the openings of the first kind 722a and the openings of the second kind 722b alternatingly in a plurality of rows, wherein the rows are arranged offset to each other, or to arrange the openings of the first kind 722a and the openings of the second kind 722b alternatingly in a plurality of columns, wherein the columns are arranged offset to each other.

Each of the openings of the first kind 722a and each of the openings of the second kind 722b comprise a through hole 722 that extends from a first surface 701 of the housing 7 all the way through the cover of the housing 7 to a second surface 702 of the housing 7. When the housing 7 is attached to a power semiconductor module arrangement, the first surface 701 is arranged on the outside of the housing 7, and the second surface 702 is arranged on the inside of the housing 7. The openings of the first kind 722a comprise a collar or sleeve 724 arranged adjacent to and forming a closed loop around the respective through hole 722, similar to what has been described with respect to FIG. 5 above. The openings of the second kind 722*b* comprise a trench or indentation 726 arranged adjacent to and forming a closed loop around the respective through hole 722. This is schematically illustrated in the diagonal top view of FIG. 7 and the cross-sectional view of FIG. 8. In the diagonal top view of FIG. 7, the alternating collars/sleeves 724 and trenches/indentations can be seen. Sections of the first surface 701 are arranged between the openings of the first kind 722*a* and the openings of the second kind 722*b*. This is also exemplarily illustrated in the cross-sectional view of FIG. 8, which shows a section of the arrangement of FIG. 7 along a section line A-A'.

In this example, the creepage distance between two neighboring through holes 722 is defined by the sum of the shortest distance s1 between the respective through holes in a horizontal direction x, a height h724 of the collar or sleeve 724 of the opening of the first kind 722*a* in a vertical direction y perpendicular to the horizontal direction, and a depth d726 of the trench or indentation 726 of the opening of the second kind 722*b* in the vertical direction y. That is, the creepage distance between two neighboring through holes 722 in the arrangement of FIG. 8 is longer than the creepage distance 80 between two neighboring through holes 722 of the arrangement of FIG. 3. However, as can be seen in the diagonal top view of FIG. 7, even a creepage distance between two neighboring openings of the first kind 722*a*, or between two neighboring openings of the second kind 722*b* is increased either by twice the height h724 of the collar or sleeve 724, or by twice the depth d726 of the trench or indentation 726. This is schematically illustrated in more detail for two neighboring openings of the first kind 722*a* in FIG. 11A, which schematically illustrates a cross sectional view along a section line B-B' of the arrangements illustrated in FIGS. 7 and 10.

Figure 4:
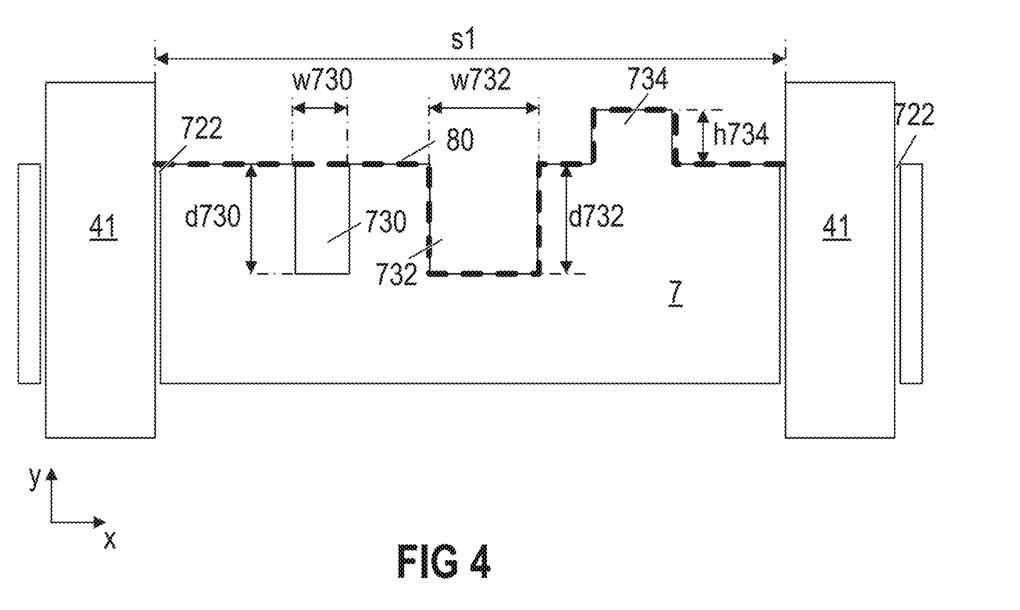
FIG. 4 is a cross-sectional view of another section of a housing.

A width w726 of a trench or indentation 726 in a horizontal direction may be large enough in order for the trench or indentation 726 to be able to extend the creepage distance, as has been discussed with respect to FIG. 4 above. For example, a width w726 of a trench or indentation 726 in a horizontal direction may be at least 1 mm. Other widths may be possible, depending on the degree of contamination of the environment in which the power semiconductor module arrangement is mounted during use. Any possible production tolerances may also be considered in this regard. That is, the width w726 of a trench or indentation 726 may be somewhat larger than the required minimum width. In this way it can be guaranteed that the trench or indentation 726 is still wide enough even if its actual width is reduced by a certain degree due to production tolerances.

Figure 7:
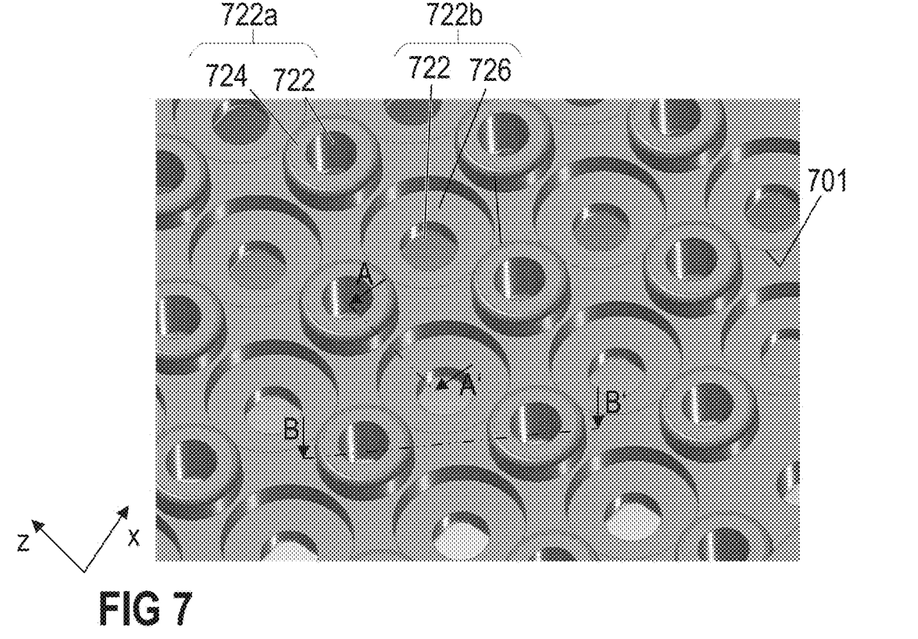
FIG. 7 is a top diagonal view of a section of a top of a housing according to one example
Figure 8:
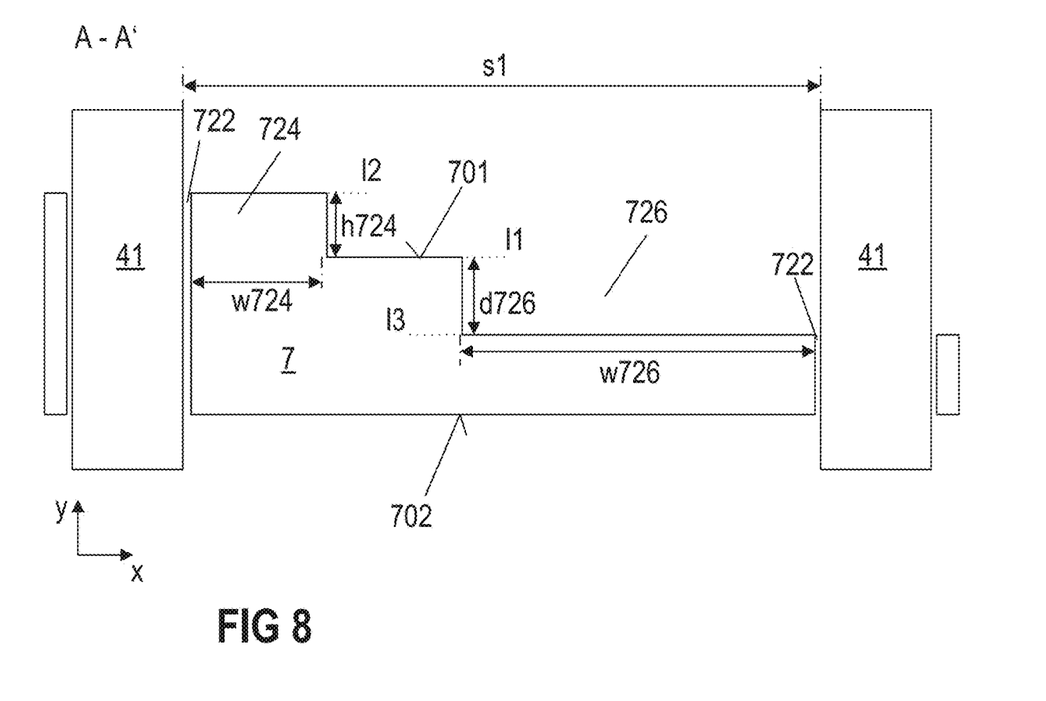
FIG. 8 is a cross-sectional view of a section of a top according to one example.

In the examples illustrated in FIGS. 7 and 8, the sum of a width w724 of the collar or sleeve 724 and the width w726 of the trench or indentation 726 is less than the shortest direct distance s1 between the first through hole 722 and the second through hole 722. That is, the collar or sleeve 724 and the trench or indentation 726 do not directly adjoin each other. A section of the first surface 701 is arranged between the opening of the first kind 722*a* and the opening of the second kind 722*b*. This, however, is only an example.

Figure 10:
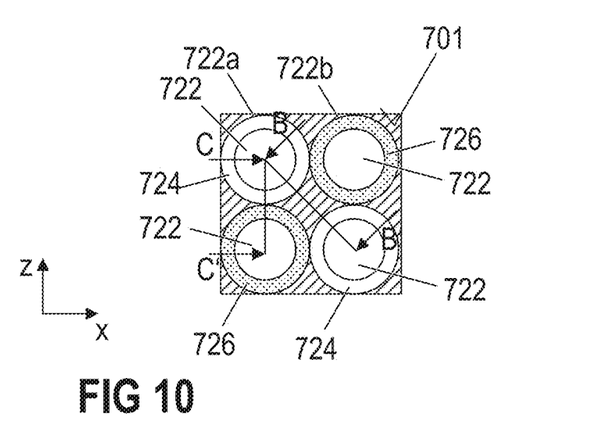
FIG. 10 is a top view of a section of a housing according to another example.
Figure 11A:
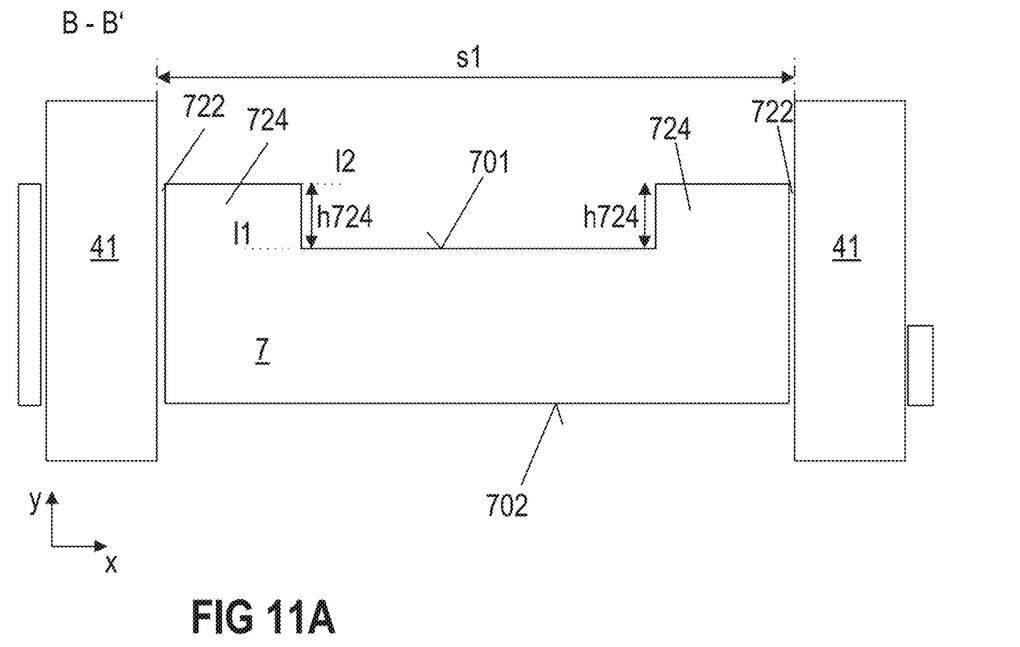
Figure 11B:
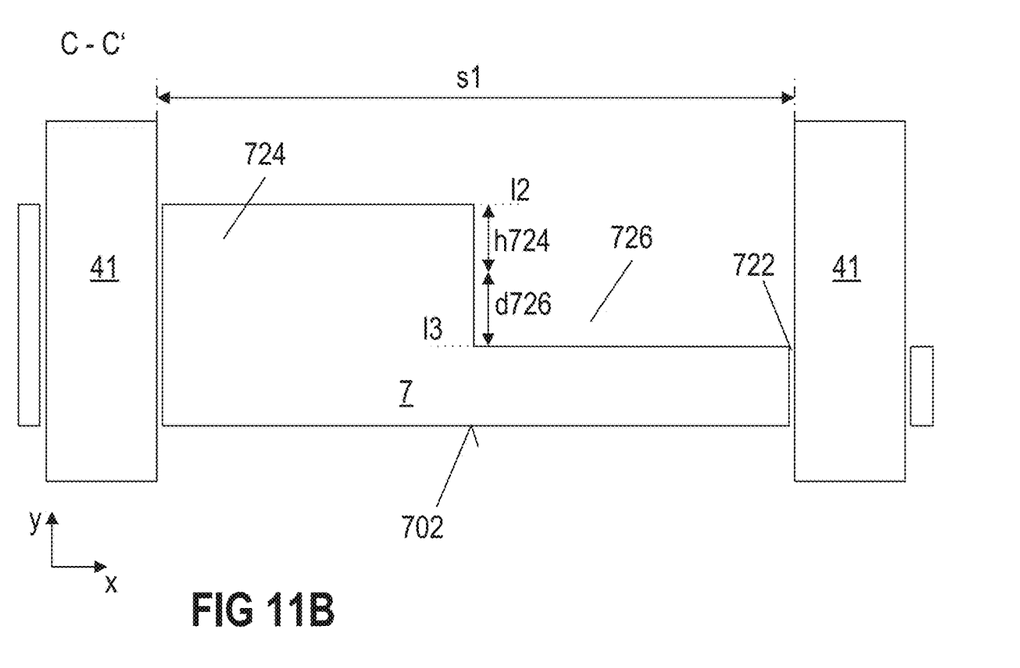

Now referring to FIG. 10, it is also possible that an opening of the first kind 722*a* and a neighboring opening of the second kind 722*b* directly adjoin each other. In the example illustrated in FIG. 10, the openings of the first kind 722*a* and the openings of the second kind 722*b* each have a round shape. An outer circumference of the collar or sleeve of an opening of the first kind 722*a* has one point of contact with the outer circumference of the trench or indentation of each neighboring opening of the second kind 722*b*, and vice versa. In this way, the first surface 701 (illustrated as crosshatched area in FIG. 10) remaining between the openings of the first and second kind 722*a*, 722*b* has a diamond shape. A cross-sectional view of the arrangement of FIG. 10 along a section line C-C' is schematically illustrated in FIG. 11B. That is, there is one direct line between the through hole 722 of an opening of the first kind 722*a*, and the through hole 722 of a neighboring opening of the second kind 722*b* on which no section of the first surface 701 is arranged between the opening of the first kind 722*a* and the opening of the second kind 722*b*.

Figure 9:
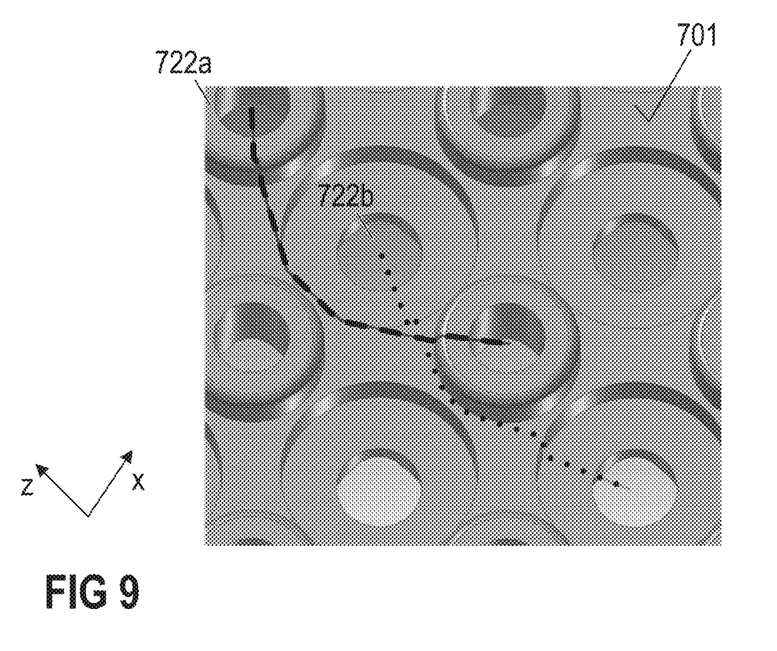
FIG. 9 is a top diagonal view of a section of a top of a housing according to another example.

In the arrangements described above, the creepage distance is not only extended between two neighboring openings of different kinds, but also between each opening of the first kind 722*a*, and the next opening of the first kind 722*a* in the same row or the same column, and between each opening of the second kind 722*b* and the next opening of the second kind 722*b* in the same row or the same column, as is schematically illustrated in FIG. 9. In FIG. 9, the creepage distance between two openings of the first kind 722*a* in the same row is indicated by means of a dashed line, and the creepage distance between two openings of the second kind 722*b* in the same row is indicated by means of a dotted line. In both cases, the creepage distance also has to overcome at least two steps.

The housing 7 can comprise or can be made of an insulating material such as a plastic material, for example. The housing may comprise a single material or may be formed of two or more different materials. Many different materials are generally possible. According to one example, a housing is formed of a thermoplastic material that further comprises additional components made of a comparably soft material such as TPE (thermoplastic elastomer) or LSR (liquid silicone rubber), for example. The required minimum length of the creepage distance depends on the operating voltage during the use of the power semiconductor module, as well as on the material of the housing 7, for example. Different materials have a different comparative tracking index (CTI) which affects the required minimum creepage distance. If a housing 7 is made of a material having a comparably high CTI of, e.g., more than 400 or even more than 600, the creepage distance may be comparably short. If, however, the housing 7 is made of a material having a comparably low CTI of, e.g., less than 400, or even less than 175, the creepage distance is generally required to be significantly longer. Therefore, the arrangement comprising the openings of the first kind 722*a* and the openings of the second kind 722*b* may be used in combination with a housing comprising a CTI of less than 400 or less than 175, for example. The arrangement may also be used for housings having a higher CTI. This, however, may not be required in order to fulfill standard regulations in this regard. Materials having a CTI of more than 400 or more than 600 generally have several disadvantages in terms of breaking strength, for example. Requirements for creepage distances for different materials are defined in standard IEC 60664-1, for example.

The arrangements described above with alternating openings of the first kind 722*a*, and openings of the second kind 722*b* provide increased creepage distances, while, at the same time, reducing space requirements. In the described arrangements, an opening of the first kind 722*a* and a neighboring opening of the second kind 722*b* can be arranged closer to each other as compared to arrangements comprising only openings of the first kind 722*a*, or only openings of the second kind 722*b*. In this way, a great number of openings 722 can be provided in a comparably small area. The collar or sleeve 724 of an opening of the first kind 722a generally requires a minimum width w724 in order to be able to form the collar or sleeve in a molding process, for example. In order to form a collar or sleeve 724, a respective indentation is formed in the mold which is filled by the mold material. If a width of such an indentation in the mold is too small, material cannot freely flow into the indentation, resulting in a faulty housing. According to one example, therefore, the width w724 of the collar or sleeve 724 in a horizontal direction is between 1 mm and 2 mm.

The collars or sleeves 724 as well as the trenches or indentations 726 in the examples described above have a round form. It is, however, also possible that the collars or sleeves 724 and/or the trenches or indentations 726 have any other form such as an oval, square, rectangular, diamond, or honeycomb shape, for example. The shape of the collars or sleeves 724 and/or the trenches or indentations 726 may be the same or may be different from the shape of the through holes 722. The collars or sleeves 724 and/or the trenches or indentations 726 and the respective through holes 722 may be concentric, and the collars or sleeves 724 and/or the trenches or indentations 726 and the respective through holes 722 may be symmetrical. It is, however, also possible that the collars or sleeves 724 and/or the trenches or indentations 726 and the respective through holes 722 are eccentric, and the collars or sleeves 724 and/or the trenches or indentations 726 and the respective through holes 722 are asymmetric. Further, in the examples illustrated above, the housing comprises three different levels 11, 12, 13. It is, however, also possible to form more than three different levels between two neighboring openings.

According to one example, a method for forming a top of a housing 7 comprises forming a plurality of openings of a first kind 722a, each of the openings of the first kind 722a comprising a first through hole 722 that extends through the top from the first surface 701 to the second surface 702, and forming a plurality of openings of a second kind 722b, each of the openings of the second kind 722b comprising a second through hole 722 that extends through the top from the first surface 701 to the second surface 702. As has been described above, the plurality of openings of the first kind 722a and the plurality of openings of the second kind 722b are arranged alternatingly in a regular pattern, each of the plurality of openings of the first kind 722a comprises a collar or sleeve 724 arranged adjacent to and forming a closed loop around the respective first through hole 722, and each of the plurality of openings of the second kind 722b comprises a trench or indentation 726 arranged adjacent to and forming a closed loop around the respective second through hole The top may be formed by means of an injection molding process and the openings of the first kind and second kind 722a, 722b may be formed during the injection molding process by providing a respective injection mold.

According to another example, the top may be formed in a first step and, in at least one subsequent step, the openings of the first and second kind 722a, 722b are formed by forming through holes 722 and trenches or indentations 726 in, and collars or sleeves 724 on the top.

Figure 12:
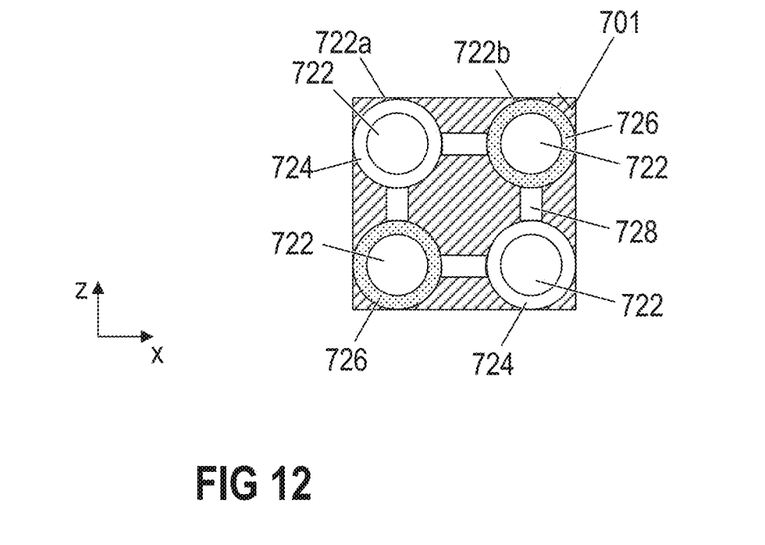
FIG. 12 is a top view of a section of a housing according to another example.

In the examples illustrated by means of FIGS. 7 and 9, for example, the openings of the first kind 722a and the openings of the second kind 722b are arranged distant to each other such that the collar or sleeve 724 of each of the openings of the first kind 722a does not contact the trench or indentation 726 of its neighboring openings of the second kind 722b. Further, the collar or sleeve 724 of each of the openings of the first kind 722a does not contact the collar or sleeve 724 of any of the other openings of the first kind 722a. As is schematically illustrated in FIG. 12, however, it is possible that a bar or bridge or any other suitable structure 728 extends between the collar or sleeve 724 of a first opening of the first kind 722a and the collar or sleeve of a second opening of the first kind 722a. That is, the collars or sleeves 724 of different openings of the first kind 722a may be connected to each other by means of a bar or bridge 728 or any other structure. This also applies for the openings of the second kind 722b. That is, a bar or bridge 728 may extend between the trench or indentation 726 of a first opening of the second kind 722b and the trench or indentation 726 of a second opening of the second kind 722b. In this way, the trenches or indentations 726 of different openings of the second kind 722b may be connected to each other by means of a bar or bridge 728 or any other structure.

The invention claimed is:

1. A housing for a power semiconductor module arrangement comprises sidewalls and a top, wherein the top comprises:
   a first surface extending in a first horizontal plane and a second surface opposite and in parallel to the first surface;
   a plurality of openings of a first kind, each of the plurality of openings of the first kind comprising a first through hole extending through the top from the first surface to the second surface; and
   a plurality of openings of a second kind, each of the plurality of openings of the second kind comprising a second through hole extending through the top from the first surface to the second surface, wherein
   the plurality of openings of the first kind and the plurality of openings of the second kind are arranged alternatingly in a regular pattern,
   each of the plurality of openings of the first kind comprises a collar or sleeve arranged adjacent to and forming a closed loop around a respective first through hole, and
   each of the plurality of openings of the second kind comprises a trench or indentation arranged adjacent to and forming a closed loop around a respective second through hole.

2. The housing of claim 1, wherein
   a top surface of each of the collars or sleeves is arranged in a second plane that is arranged further away from the second surface than the first surface, and
   a bottom surface of each of the trenches or indentations is arranged in a third plane that is arranged closer to the second surface than the first surface.

3. The housing of claim 1, wherein each of the trenches or indentations surrounding the respective second through hole has a width in a horizontal direction of at least 1 mm.

4. The housing of claim 1, wherein each of the collars or sleeves surrounding the respective first through hole has a width in a horizontal direction of between 1 mm and 2 mm.

5. The housing of claim 1, wherein the plurality of openings of the first kind and the plurality of openings of the second kind are arranged alternatingly in a plurality of rows and columns.

6. The housing of claim 1, wherein a creepage distance between the first through hole of an opening of the first kind and the second through hole of a neighboring opening of the second kind is defined by the sum of a shortest distance between an outer diameter of the first through hole and an outer diameter of the second through hole in a horizontal direction, a height of the collar or sleeve in a vertical direction that is perpendicular to the horizontal direction, and a depth of the trench or indentation in the vertical direction.

7. The housing of claim 1, wherein the collar or sleeve of each of the openings of the first kind directly adjoins the trench or indentation of each of its neighboring openings of the second kind.

8. The housing of claim 1, wherein
the collars or sleeves of the openings of the first kind have an oval, square, rectangular, diamond, or honeycomb shape, and
the trenches or indentations of the openings of the second kind have an oval, square, rectangular, diamond, or honeycomb shape.

9. The housing of claim 1, wherein at least one of
the collars or sleeves of the openings of the first kind and the trenches or indentations of the openings of the second kind and their respective through holes are concentric, and
the collars or sleeves of the openings of the first kind and the trenches or indentations of the openings of the second kind and their respective through holes are symmetrical.

10. A power semiconductor module arrangement comprising:
a substrate;
at least one semiconductor body arranged on a top surface of the substrate; and
a housing according to claim 1, wherein the substrate with the at least one semiconductor body arranged thereon is arranged within the housing.

11. The power semiconductor module arrangement of claim 10, further comprising at least one terminal element, wherein a first end of each of the at least one terminal element is coupled to the substrate;
each of the at least one terminal element extends through the inside of the housing; and
a second end of each of the at least one terminal element protrudes either through the first through hole of one of the openings of the first kind or through the second through hole of one of the openings of the second kind to the outside of the housing.

12. The power semiconductor module arrangement of claim 10, further comprising at least one bar or bridge, wherein at least one of the collars or sleeves of different openings of the first kind are connected to each other by means of one of the at least one bar or bridge; and
the trenches or indentations of different openings of the second kind are connected to each other by means of one of the at least one bar or bridge.

13. A method for forming a top of a housing, wherein the top comprises a first surface extending in a first horizontal plane and a second surface opposite and in parallel to the first surface, the method comprising:
forming a plurality of openings of a first kind, each of the openings of the first kind comprising a first through hole that extends through the top from the first surface to the second surface; and
forming a plurality of openings of a second kind, each of the openings of the second kind comprising a second through hole that extends through the top from the first surface to the second surface, wherein
the plurality of openings of the first kind and the plurality of openings of the second kind are arranged alternatingly in a regular pattern,
each of the plurality of openings of the first kind comprises a collar or sleeve arranged adjacent to and forming a closed loop around a respective first through hole, and
each of the plurality of openings of the second kind comprises a trench or indentation arranged adjacent to and forming a closed loop around a respective second through hole.

14. The method of claim 13, wherein the top is formed by means of an injection molding process and the openings of the first kind and second kind are formed during the injection molding process by providing a respective injection mold.

15. The method of claim 13, wherein the top is formed in a first step and, in at least one subsequent step, the openings of the first and second kind are formed by forming through holes and trenches or indentations in, and collars or sleeves on the top.

* * * * *